United States Patent [19]  [11] 4,156,851
Winters  [45] May 29, 1979

[54] CONSTANT-PHASE DELAY NETWORK

[76] Inventor: Paul N. Winters, P.O. Box 327, Trumann, Ark. 72472

[21] Appl. No.: 844,608

[22] Filed: Oct. 25, 1977

[51] Int. Cl.² .................. H03D 3/06; H03K 5/159
[52] U.S. Cl. ............................. 328/155; 328/55; 332/16 R
[58] Field of Search ................ 328/55, 140, 155; 332/16 R

[56] References Cited
U.S. PATENT DOCUMENTS

| | | | |
|---|---|---|---|
| 3,206,686 | 9/1965 | Goor | 328/55 X |
| 3,453,552 | 7/1969 | Whang et al. | 328/155 |
| 3,546,703 | 12/1970 | Kurth | 325/55 |
| 3,665,328 | 5/1972 | Widl | 328/155 X |
| 4,095,185 | 6/1978 | Winters | 328/55 |

Primary Examiner—John S. Heyman

[57] ABSTRACT

A method of obtaining a constant-phase across a frequency band between points containing delay elements is shown. The delayed output is subtracted from the undelayed input in demodulators operating in quadrature to obtain quadrature phase-error signals. The phase-error signals are filtered and then additively modulated onto the delayed output with single-sideband techniques to correct the phase, thereby producing a delayed output signal that is in-phase with the undelayed signal.

6 Claims, 2 Drawing Figures

CONSTANT-PHASE DELAY NETWORK

BACKGROUND OF THE INVENTION

This invention relates to phase-connecting circuits for energy transmission networks having delay elements therein, and is related to Pat. application 787,373 filed Apr. 14, 1977, and now Pat. No. 4,095,185 titled ELECTRICAL ENERGY TRANSMISSION NETWORK; being an alternate method of accomplishing the objects therein with only delay network, and offering certain other advantages over the previously referred to application, which shall subsequently become apparent.

SUMMARY OF THE INVENTION

In accordance with the present invention an energy transmission network having energy storing delay elements therein through which a sinusoidally varying current is transmitted, is modified so as to obtain an output signal that is substantially in-phase with the undelayed signal applied to the said energy storing delay elements. The phase-corrective circuit is operative to correct the output phase by additively modulating the output signal with phase error signals in quadrature obtained by comparing the input and output signals of the energy storing delay elements in quadrature connected demodulators. The phase error signals thus developed are dc signals if the input signal is of a single unchanging frequency. The magnitudes of the dc signals are proportional to the amplitude of the input signal and also to the relative phase angle between the input and output of the delay elements for that particular frequency. As the dc signals are in quadrature, when one of the dc signals is at a maximum value at a particular frequency, the other dc signal will be zero. If the input signal changes in frequency the dc signals when added vectorally rotate through a phase angle which can be multiples of 360 degrees, in every instance corresponding to the phase difference between the input and output of the energy storing delay elements. The quadrature dc signals thus developed can be filtered with low-pass filters to control attack and decay times and also to reduce noice which may be associated with the signals. After filtering, the dc phase error signals are then modulated additively onto the output signal of the energy storing delay elements with a single-sideband technique, thereby shifting the phase of the output signal so that it is substantially in-phase with the undelayed input signal to the energy storing delay elements, yet possessing the amplitude and delay characteristics of the said energy storing delay elements, with attack and decay times as modified by the low-phase filters.

The described technique, together with other objects and advantages which will subsequently become apparent, reside in the details of construction and operation as more fully hereinafter described and claimed, reference being had to the accompanying drawings forming a part hereof, wherein like numerals refer to like parts throughout.

DETAILED DESCRIPTION OF PREFERRED EMBODIMENTS

Figure 1:
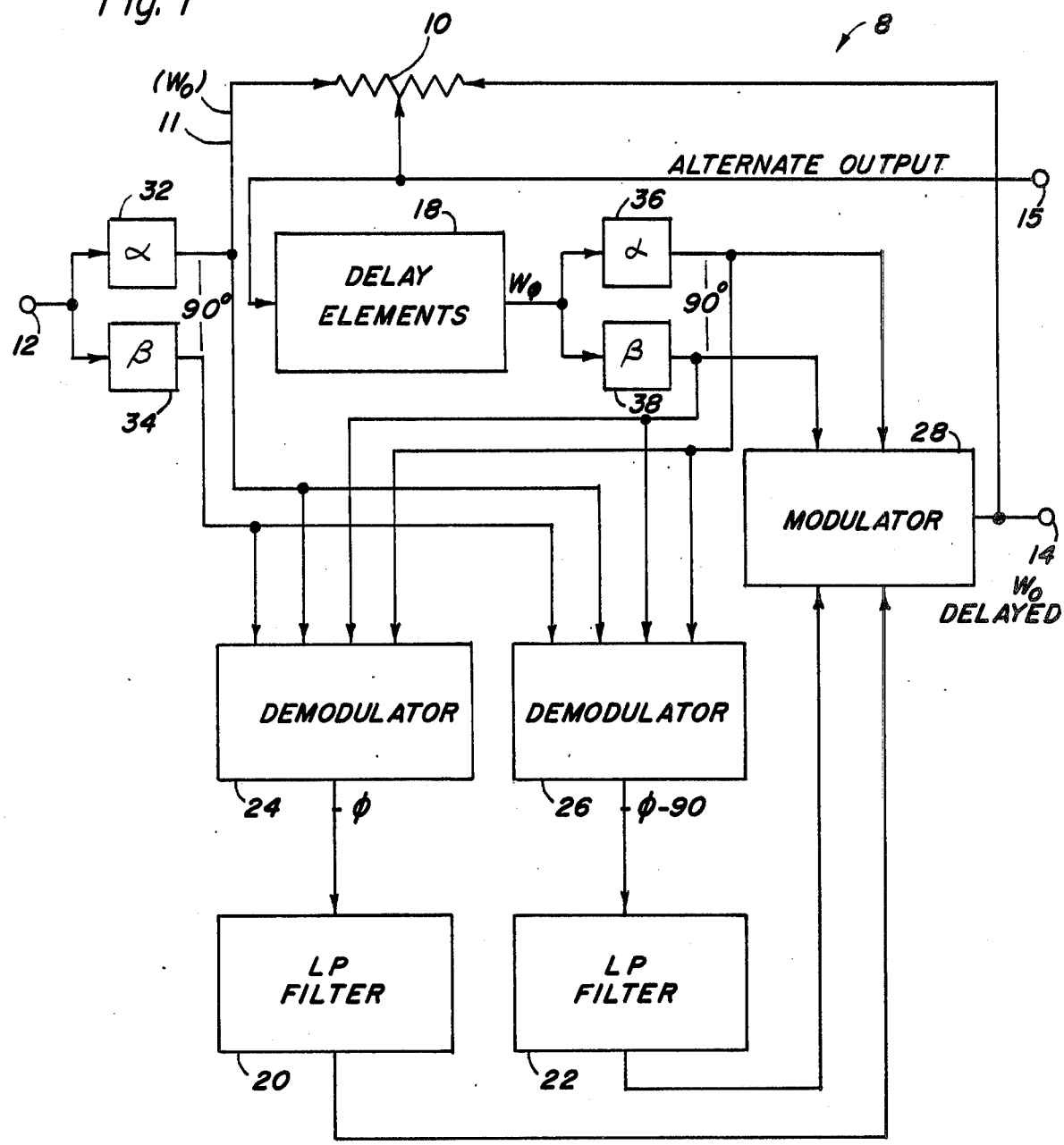
FIG. 1 is a schematic block diagram showing a constant-phase delay network in accordance with the present invention with integration capabilities.

Referring now to the drawings in detail, FIG. 1 diagramatically illustrates a constant-phase delay network generally referred to by reference numeral 8 arranged in accordance with the present invention. In this arrangement, electrical signal energy that is sinusoidally varied is applied to the input terminal 12 of the network. Modulating components may be associated with the sinusoidally varied input signal. A time delayed output signal is obtained at the output terminal 14 that is in-phase with the undelayed signal designated Wo appearing on line 11. Therefore a portion of the output signal at terminal 14 may be added to a portion of the signal on line 11 by means of potentiometer 10 to perform integration. The output at terminal 14 is not, however, generally in-phase with the input signal at terminal 12 as in the previous constant-phase delay networks employing divided delay sections shown in U.S. Pat. application Ser. No. 787,373 and the patent application later filed relating thereto.

With continued reference to FIG. 1, the input signal at terminal 12 is divided into quadrature components by networks 32 and 34. The output of delay elements 18 is divided into quadrature components by networks 36 and 38. The delayed and undelayed quadrature components of the signal are then applied to demodulators 24 and 26. Demodulators 24 and 26 are of the single-sideband type in order to reduce unwanted products of the demodulation processes. The operation of such modulators is described in a paper titled "Quadrature Signal Processing Techniques" which was published in the 1968 Wescon Technical Papers, Session 12, New Developments in Digital Communications; however, the operation of the present invention is not restricted to the use of such modulators as therein described. The demodulators are so connected as to produce phase/frequency error information in quadrature. The amplitude of the resulting signals is proportional to the input amplitudes and their vector sum describes in which quadrant the error signal lies, the resulting angles being denoted by $-\phi$ and $-\phi-90$ degrees, respectively. These signals are then applied to low-pass filters 20 and 22 respectively which are inserted to control the slew rate, attack and decay rates of the error signals and also to reduce noise that may be associated with the error signals. The outputs of the low-pass filters 20 and 22 are applied to additive modulator 28 along with the delayed quadrature signals from networks 36 and 38. Additive modulator 28 adds the phase/frequency components of the quadrature error signals to the delayed quadrature signals to produce a phase-corrected, delayed output signal that is in-phase with the undelayed signal on line 11.

When there is more than one signal frequency applied to the input terminal 12, the outputs of the demodulators 24 and 26 are complex signals containing phase information of all the signal frequencies simultaneously, as well as beat frequencies between the various input signals. If the beat frequencies cannot pass through the low-pass filters 20 and 22, then the filter outputs will assume the dc voltages corresponding to the largest signal providing the network is in an integrating mode of operation. All of the other signals will be suppressed by an amount corresponding to the relative phase difference supplied by the delay elements 18 for the other signal frequencies in combination with the integrating factor as controlled by the feedback control 10. This feature is in addition to the noise reduction feature caused by integrating the larger signal, and is best described as a 'capture' effect.

With continued reference to FIG. 1, if the delay elements 18 cause more than 360 degrees of phase-shift across the frequency band of interest, the phase error signals $-\phi$ and $-\phi-90$ degrees cause multiple integration frequencies simultaneously. This might not be noticed unless there is a signal at one of the multiple integration points, in which case it cannot be suppressed by the larger signal.

Figure 2:
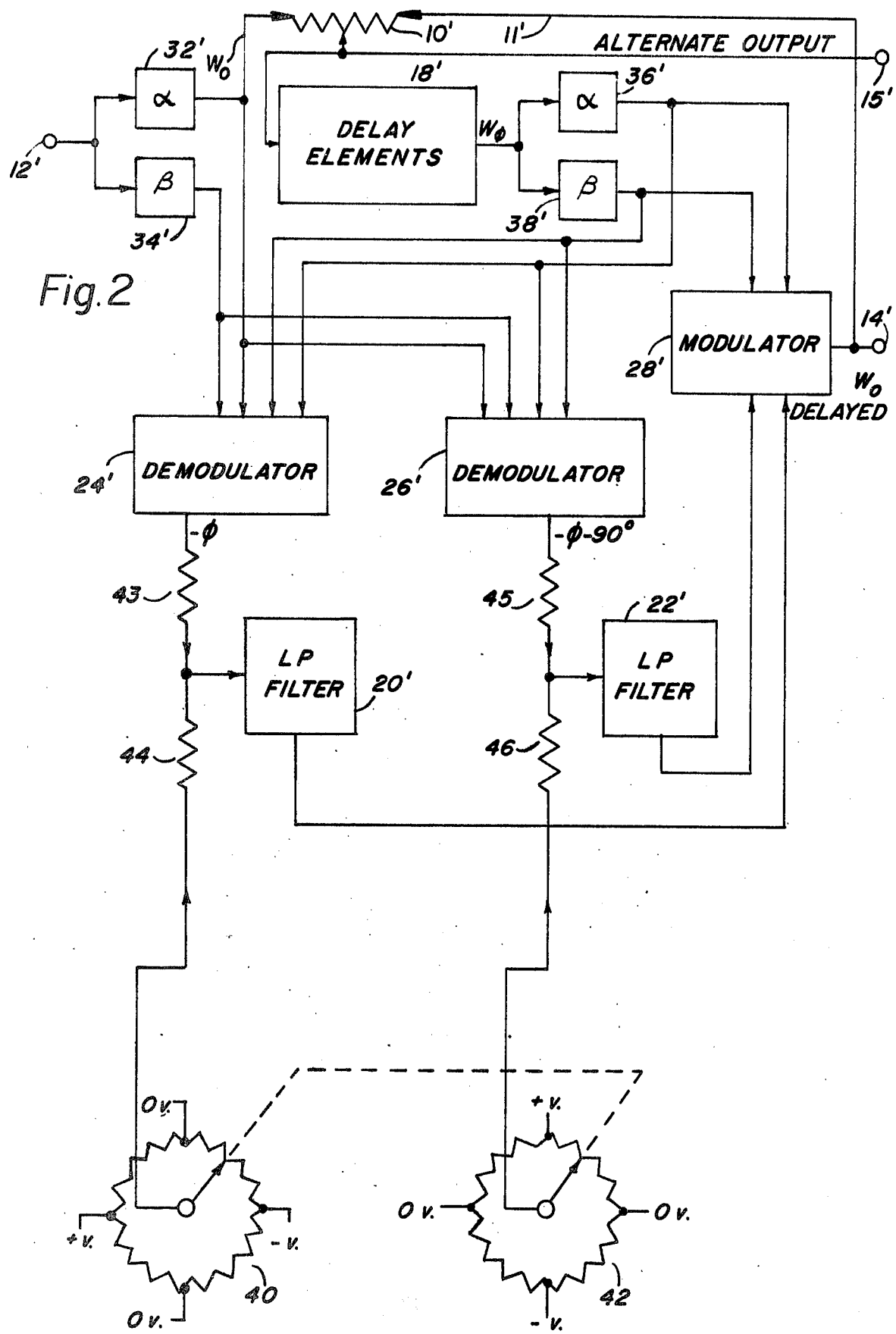
FIG. 2 is a schematic block diagram showing a constant-phase delay network with a feedback tuning feature.

FIG. 2 illustrates a constant-phase delay network with a tuning feature generally referred to by reference numeral 11'. This network performs the same functions as the network of FIG. 1 except that externally applied dc voltages in quadrature from potentiometers 40 and 42 are added to the phase error voltages from demodulators 24' and 26' designated as $-\phi$ and $-\phi-90$ degrees by means of resistors 43 and 44, and 45 and 46 respectively. By adjusting the quadrature dc voltages from potentiometers 40 and 42, the frequency corresponding to an in-phase condition can be tuned across the frequency range of the delay elements 18'; with integration feedback applied by means of potentiometer 10' this frequency becomes the frequency of maximum response. In a radio receiver application for example, the network of FIG. 2 may be placed in the intermediate-frequency stages, and a certain amount of suppression of unwanted signals based on frequency differences may be obtained. As a signal is approached by adjusting the potentiometers 40 and 42, at some point within the control of the designer of the network the voltages from the demodulators 24' and 26' when filtered through the low-pass filters 20' and 22' will suddenly shift in such a direction as to cause capture of the signal as previously described for the network of FIG. 1. In this manner it is possible to cause suppression of undesired signals to some extent based on frequency differences even though they may be somewhat larger in amplitude than the desired signal by tuning the network close to the desired signal.

Any other method of shifting the phase of the output of a network containing delay elements can cause the point of maximum response to shift in the frequency range of the delay elements with feedback applied; for example cascaded RC networks with ganged potentiometers can be used; however, such an arrangement will not in general exhibit the capture effect as described.

The foregoing is considered as illustrative only of the principles of the invention; further, since numerous modifications and changes will readily occur to those skilled in the art, it is not desired to limit the invention to the exact construction and operation shown and described, nor limit the uses of the invention to the examples given, and accordingly all modifications and equvalents may be restored to, falling within the scope of the invention.

What is claimed is as follows:

1. A method of maintaining a substantially constant phase relationship between the input and output signals of a portion of an energy transmission network containing delay elements producing a change in phase of the transmitted energy with respect to an input frequency thereof, including the steps of: comparing the input and output signals of the delay elements to obtain signals proportional to the phase difference appearing between the said input and output signals of the said delay elements; filtering the said phase difference signals; and additively modulating the said output signals of the said delay elements with the said filtered phase difference signals in order to produce a delayed output signal that is substantially in-phase with the input signal to the said delay elements.

2. The method of claim 1 wherein said transmitted energy is a sinusoidally varied signal.

3. The method of claim 2 wherein said transmitted energy includes additional modulation signal components.

4. The method of claim 1 wherein said transmission network further includes a feedback path from the output terminal to the input terminal to form a summing junction wherein the input signals and output signals are added and applied to the said energy storing delay elements to perform the additional step of integration, wherein the transmission of energy through said feedback path is limited to a feedback factor less than unity.

5. The method of claim 2 wherein said transmission network further includes a feedback path from the output terminal to the input terminal to form a summing junction wherein the input signals and output signals are added and applied to the said energy storing elements to perform the additional step of integration, wherein the transmission of energy through said feedback path is limited to a feedback factor less than unity.

6. The method of claim 5 including externally controlled phase-shifting means for controlling the frequency of maximum response.

* * * * *